United States Patent
Darvishi et al.

(10) Patent No.: US 9,847,772 B2
(45) Date of Patent: Dec. 19, 2017

(54) N-PATH FILTERS WITH FLATTER FREQUENCY RESPONSE

(71) Applicant: QUALCOMM Incorporated, San Diego, CA (US)

(72) Inventors: Milad Darvishi, San Diego, CA (US); Hajir Hedayati, San Diego, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/014,305

(22) Filed: Feb. 3, 2016

(65) Prior Publication Data

US 2017/0222628 A1    Aug. 3, 2017

(51) Int. Cl.
*H03K 5/00*    (2006.01)
*H03H 19/00*    (2006.01)

(52) U.S. Cl.
CPC ................ *H03H 19/002* (2013.01)

(58) Field of Classification Search
CPC ............. H03H 11/0422; H03H 11/04; H03H 11/1291; H03H 11/1213; H03K 5/1252
USPC ................ 327/551–559, 336, 337, 355–360
See application file for complete search history.

(56) References Cited

U.S. PATENT DOCUMENTS

| | | | |
|---|---|---|---|
| 4,319,207 A * | 3/1982 | Gignoux | H03H 15/00 327/554 |
| 6,678,511 B2 | 1/2004 | Hwang et al. | |
| 7,804,328 B2 * | 9/2010 | Pentakota | H03F 3/505 326/31 |
| 7,902,923 B2 | 3/2011 | Li et al. | |
| 7,990,207 B2 * | 8/2011 | Nishimori | G05F 3/24 327/539 |
| 8,665,028 B2 | 3/2014 | Kim et al. | |
| 9,136,815 B2 * | 9/2015 | Aggarwal | H03H 7/12 |
| 2005/0083151 A1 | 4/2005 | Xiao et al. | |
| 2014/0132357 A1 * | 5/2014 | Larson | H03F 1/223 330/303 |
| 2014/0329484 A1 | 11/2014 | Lau et al. | |

(Continued)

FOREIGN PATENT DOCUMENTS

DE    1541970 A1    4/1970

OTHER PUBLICATIONS

Antoniou A., "Gyrators using operational amplifiers," Electronics Letters, Aug. 1967, vol. 3, No. 8, pp. 350-352.

(Continued)

*Primary Examiner* — Dinh T Le
(74) *Attorney, Agent, or Firm* — Patterson & Sheridan, LLP

(57) ABSTRACT

Certain aspects of the present disclosure provide N-path filters with wider passbands and steeper rejection than conventional N-path filters with only a single pole in each filter path. These N-path filters also have a flatter passband with decreased passband droop. One example N-path filter generally includes a plurality of branches selectively connected with a common node, each branch of the N-path filter comprising a switch connected in series with an impedance comprising a common drain amplifier circuit. In certain aspects, the amplifier circuit may include a degeneration circuit for stability and/or a poly-phase feedback circuit to reduce in-band peaking.

21 Claims, 14 Drawing Sheets

(56) References Cited

U.S. PATENT DOCUMENTS

2015/0063509 A1 3/2015 Hedayati et al.
2015/0288392 A1 10/2015 Floyd et al.

OTHER PUBLICATIONS

Darvishi M., et al., "Design of Active N-Path Filters," IEEE Journal of Solid-State Circuits, 2013, vol. 48 (12), pp. 2962-2976.

Ghaffari A., et al., "Tunable High-Q N-Path Band-Pass Filters: Modeling and Verification," IEEE Journal of Solid-State Circuits, 2011, 29 Pages.

Hasan M.N., et al., "Reconfigurable N-Path RF Front-end Filter with Improved Blocker Rejection," IEEE 57th International Midwest Symposium on Circuits and Systems (MWSCAS), Aug. 2014, pp. 69-72.

Khatri H., et al., "An Active Transmitter Leakage Suppression Technique for CMOS SAW-Less CDMA Receivers," IEEE Journal of Solid-State Circuits, Aug. 2010, vol. 45 (8), pp. 1590-1601.

Leuciuc A, "Realisation of immittance functions with complex singularities by means of modified Antoniou GIC," Electronics Letters, May 11, 1995, vol. 31, Issue. 10, pp. 770-771.

Siderskiy V, "The Antoniou Inductance-Simulation Circuit Derivation," Creating Chaos LLC, 2012, 10 Pages.

Hampel S.K., et al., "Wideband Inductorless Minimal area RF Front-End", ESSCIRC, 2009. ESSCIRC '09. Proceedings of, IEEE, Piscataway, NJ, USA, Sep. 14, 2009, XP031563412, pp. 96-99. ISBN: 978-1-4244-4354-3.

International Search Report and Written Opinion—PCT/US2017/014521—ISA/EPO—Apr. 20, 2017.

Neyroud O., et al., "A CMOS Integrated N-Path Filter", Solid State Circuits Conference—Digest of Technical Papers, 1978. ESSCIRC 78. 4TH European, IEEE, Sep. 18, 1978 (Sep. 18, 1978), XP032352290, pp. 197-198.

* cited by examiner

N-PATH FILTERS WITH FLATTER FREQUENCY RESPONSE

TECHNICAL FIELD

Certain aspects of the present disclosure generally relate to electronic circuits and, more particularly, to N-path filters.

BACKGROUND

Wireless communication networks are widely deployed to provide various communication services such as telephony, video, data, messaging, broadcasts, and so on. Such networks, which are usually multiple access networks, support communications for multiple users by sharing the available network resources. A wireless communication network may include a number of base stations that can support communication for a number of mobile stations. A mobile station (MS) may communicate with a base station (BS) via a downlink and an uplink. The MS and/or BS may include any of various suitable types of filters, such as an N-path filter. N-path filters may also be used for other applications in addition to wireless communications.

SUMMARY

Certain aspects of the present disclosure generally relate to N-path filters with circuitry in each filter branch to improve the flatness of the passband in the filter's frequency response.

Certain aspects of the present disclosure provide an N-path filter. The N-path filter generally includes a plurality of branches selectively connected with a common node, each branch of the N-path filter comprising a switch connected in series with an impedance comprising a common drain amplifier circuit. The N-path filter may be configured as a bandpass filter.

Certain aspects of the present disclosure provide a method for filtering a signal. The method generally includes selectively connecting each of a plurality of branches of an N-path filter with a circuit node carrying the signal, each branch of the N-path filter comprising a switch connected in series with an impedance comprising a common drain amplifier circuit.

Certain aspects of the present disclosure provide an apparatus for filtering a signal. The apparatus generally includes means for carrying the signal and means for selectively connecting each of a plurality of branches of the apparatus with the means for carrying the signal, each branch of the apparatus comprising means for amplifying the signal. For certain aspects, each branch of the apparatus further includes means for impeding the signal connected in parallel with the means for amplifying.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure provide N-path filters with wider passbands and steeper rejection than conventional N-path filters with only a single pole in each filter path. These N-path filters also have a flatter passband with decreased passband droop.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
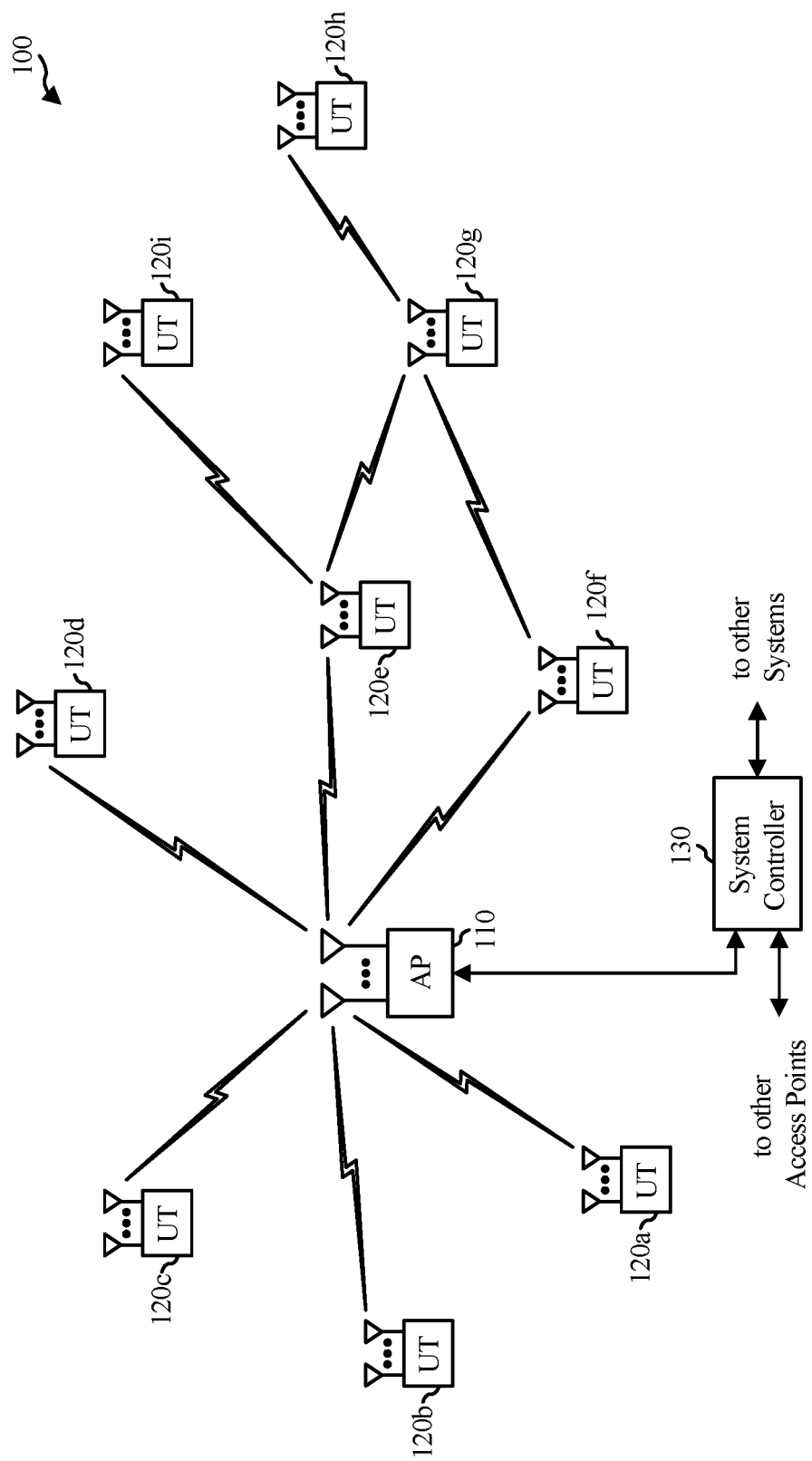
FIG. 1 is a diagram of an example wireless communications network in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

In certain aspects of the present disclosure, the access point 110 or user terminal 120 may include an N-path filter configured as a bandpass filter. Each branch of the N-path filter may include a switch connected in series with a common drain amplifier circuit.

Figure 2:
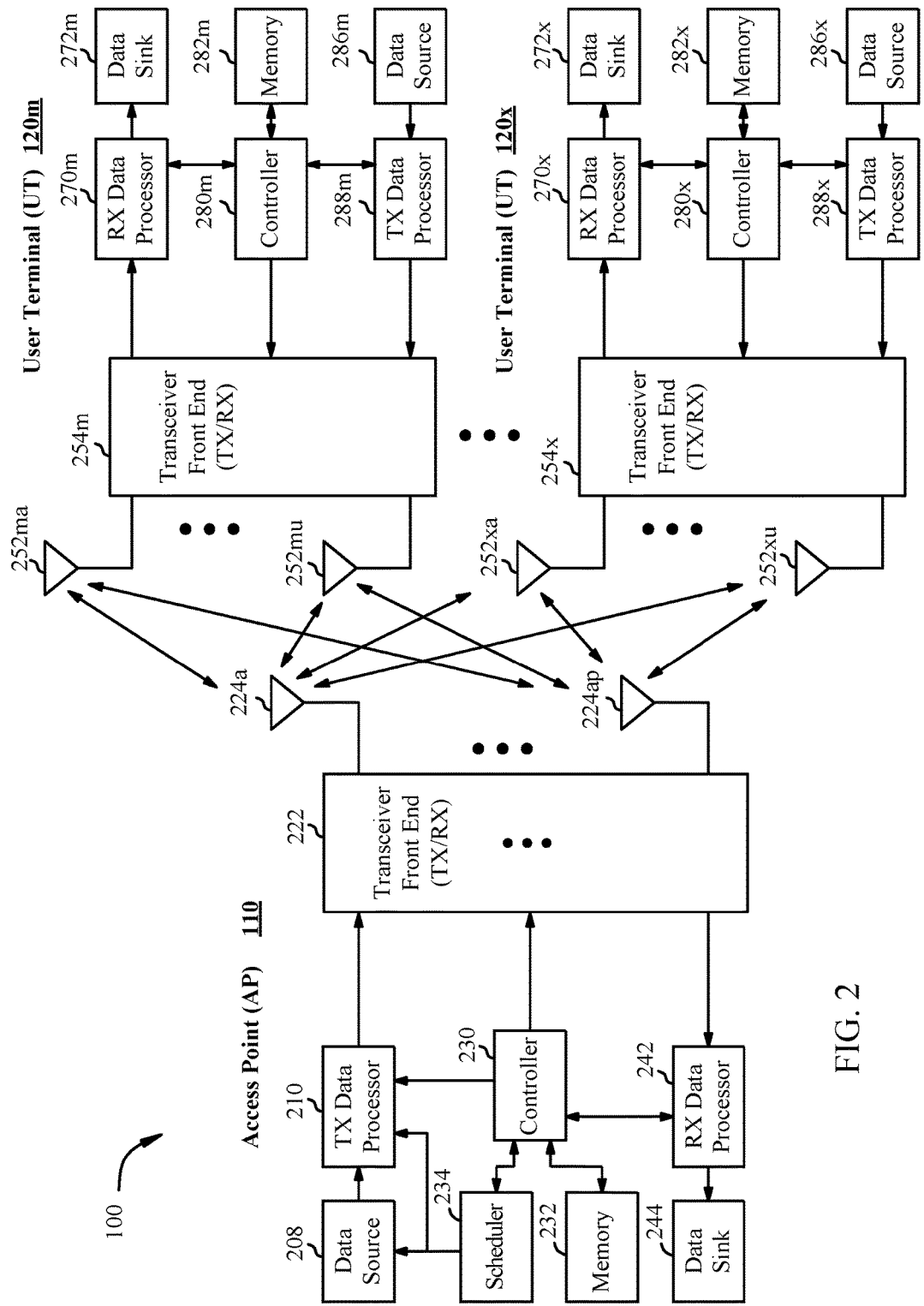
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

In certain aspects of the present disclosure, the transceiver front end 222 of access point 110 and/or the transceiver front end 254 of user terminal 120 may include an N-path filter configured as a bandpass filter. Each branch of the N-path filter may include a switch connected in series with a common drain amplifier circuit.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
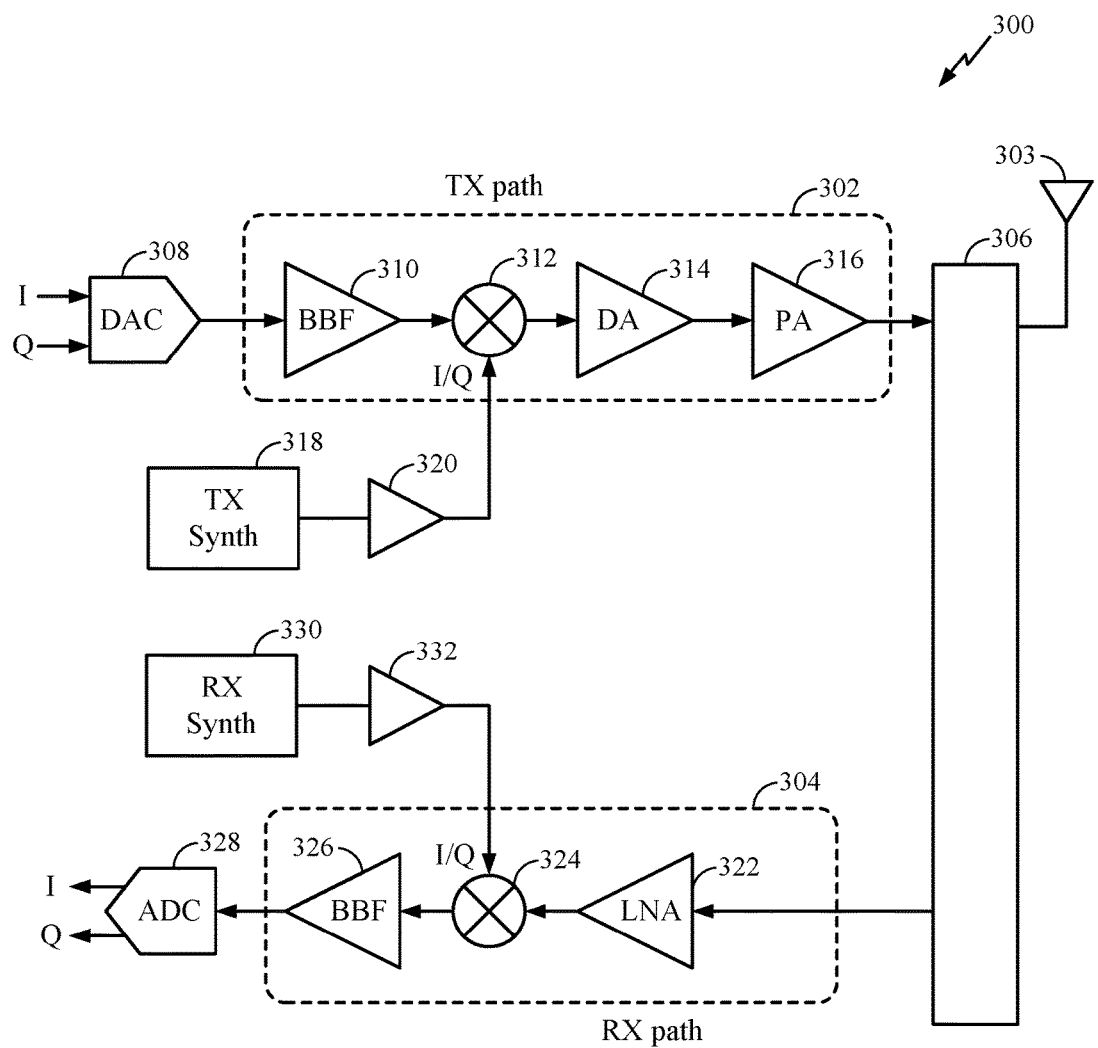
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

In certain aspects of the present disclosure, the RX path 304 may include an N-path filter configured as a bandpass filter. Each branch of the N-path filter may include a switch connected in series with a common drain amplifier circuit.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example N-Path Filter with Flat Frequency Response

Carrier aggregation is used in some radio access technologies (RATs), such as Long Term Evolution Advanced (LTE-A), in an effort to increase the bandwidth, and thereby increase bitrates. In carrier aggregation, multiple frequency resources (i.e., carriers) are allocated for sending data. Each aggregated carrier is referred to as a component carrier (CC). In LTE Rel-10, for example, up to five component carriers can be aggregated, leading to a maximum aggregated bandwidth of 100 MHz. The allocation of resources may be contiguous or non-contiguous. Non-contiguous allocation may be either intra-band (i.e., the component carriers belong to the same operating frequency band, but have one or more gaps in between) or inter-band, in which case the component carriers belong to different operating frequency bands. To implement CA in radio frequency front ends (RFFEs), various CA transceivers have been developed.

In contemporary carrier aggregation (CA) architectures, transmit (TX) leakage is one of the main performance limitations during concurrent downlink CA operations. TX leakage is the leakage from a TX chain (e.g., TX path 302) into an RX chain (e.g., RX path 304) in a transceiver front end. In non-CA applications, TX leakage and jammers are limiting factors to improving noise figure (NF) and linearity. For example, large jammers and TX leakage introduce a tighter trade-off between NF and linearity of the RX chain. Therefore, developing circuitry that reduces (e.g., filters out or suppresses) TX leakage and/or jammers is important to maintain sufficient sensitivity of the RX chain during concurrent CA or non-CA operations.

N-path filters may be used to provide high quality factor (high-Q) filters at radio frequencies. An N-path filter is generally composed of N identical linear time invariant (LTI) networks and 2N frequency mixers driven by time/phase-shifted versions of a clock signal. If the LTI networks exhibit a low-pass characteristic around DC, mixing by the mixers results in a bandpass filter response with a passband centered around the mixing frequency. That is, the input signal is down-converted to baseband, filtered by the LTI network, and then up-converted again to the original band of the input signal. The center frequency is determined by the mixing frequency and is insensitive to filter component values. A high mixing frequency combined with a narrow low-pass filter bandwidth provides a very high filter Q.

However, due to the first-order nature of some N-path filters, their passband droop can be too large to achieve a desired rejection at a TX leakage frequency (e.g., 80 MHz from the RX band). Aspects of the present disclosure provide techniques and apparatus to increase the order of an N-path filter to at least two and improve the passband of the filter considerably (e.g., remove or at least reduce the passband droop). Certain aspects of the present disclosure may also employ a low number of active components, which may lead to consuming low power.

Figure 4A:
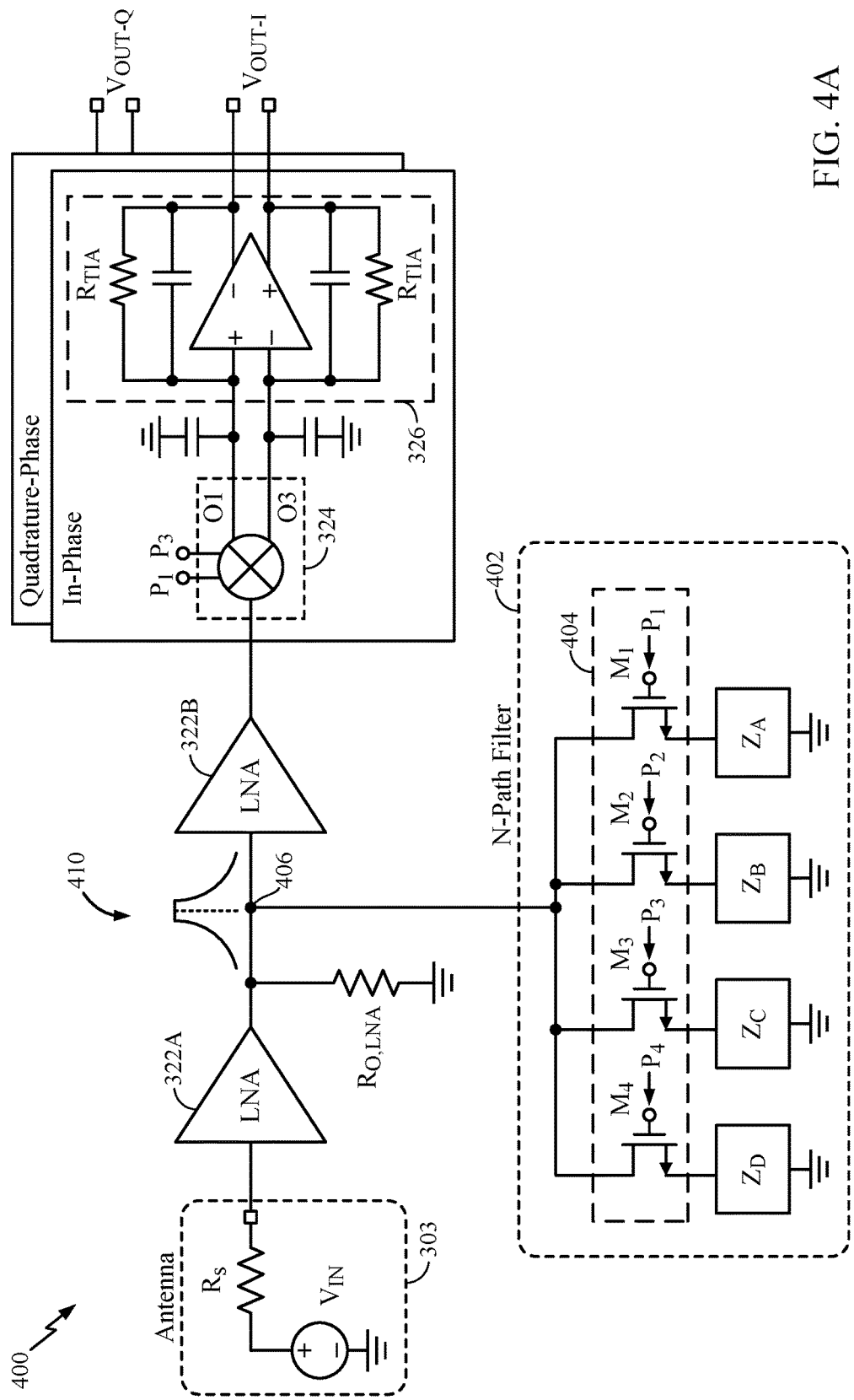
FIG. 4A illustrates an example receive chain of a radio frequency (RF) front end including an N-path filter, in accordance with certain aspects of the present disclosure.

FIG. 4A illustrates an example receive chain (e.g., RX path 304) of an RF front end comprising an N-path filter 402, in accordance with certain aspects of the present disclosure. In certain aspects, the LNA 322 of FIG. 3 may comprise two separate LNAs 322A and 322B. The first LNA 322A may be external to an RF integrated circuit (RFIC), while the second LNA 322B may be included in the RFIC, along with other circuits (e.g., the mixer 324 and the BBF 326). The N-path filter 402 may be connected with a node 406 between the LNAs 322A and 322B. In this manner, the N-path filter 402 may function as a shunt filter having frequency response 410 in an effort to pass signals in the desired RX band and reject signals having frequencies outside this band (including TX leakage and jammers).

The N-path filter 402 has a number N=4 of parallel branches selectively connected with the node 406, which is a common node for the plurality of branches. Those having ordinary skill in the art of N-path filters will understand that there may be more or less than N=4 branches in any of the various aspects of the present disclosure provided herein. For ease of description and understanding by the reader, the remainder of the disclosure will present circuits with N=4 branches.

The N-path filter 402 may include a number of switches 404 (e.g., N switches, one in each filter branch), which may be implemented with n-channel metal-oxide-semiconductor (NMOS) transistors, individually labeled as transistors $M_1$, $M_2$, $M_3$, and $M_4$ in FIG. 4A. For other aspects, the switches 404 in the N-path filter may be implemented with p-channel metal-oxide-semiconductor (PMOS) transistors. However, for ease of description and understanding by the reader, the remainder of the disclosure will use NMOS transistors to implement the branch switches 404 of the N-path filters.

Figure 4B:
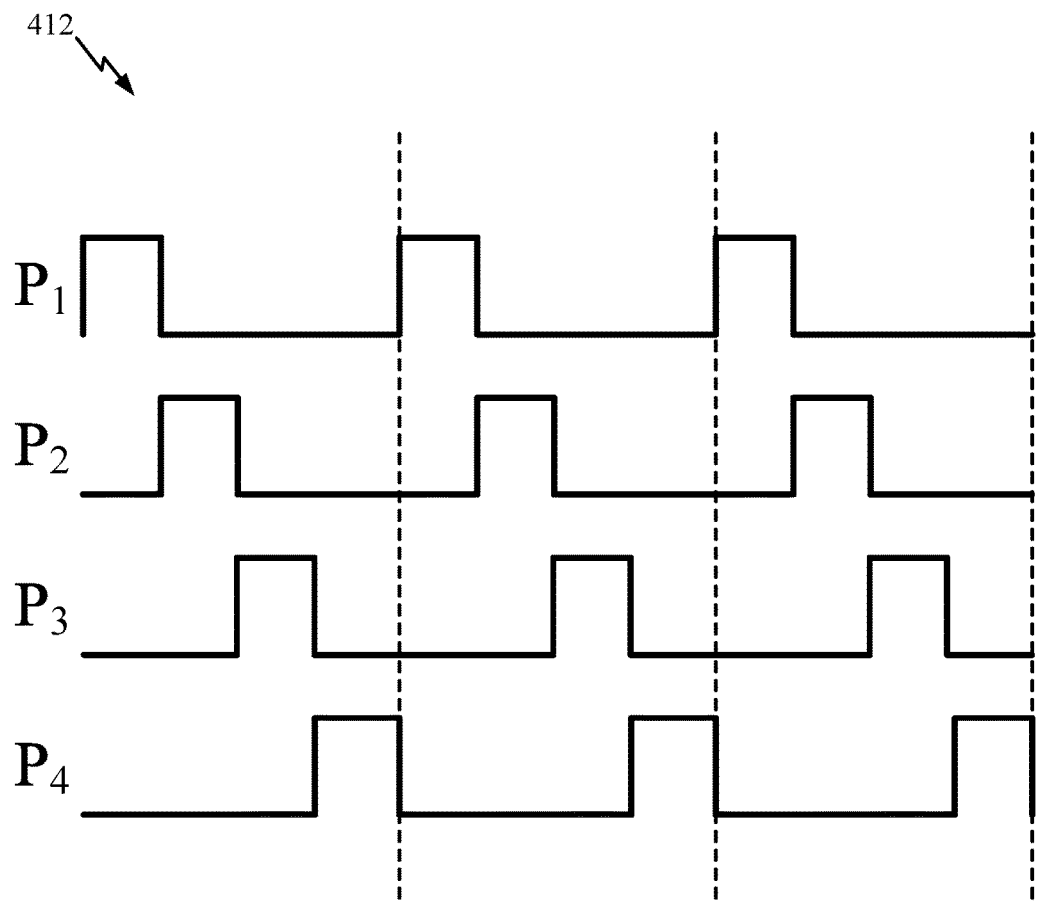
FIG. 4B is an example timing diagram illustrating signals used to control switching operations of transistors in the N-path filter of FIG. 4A, in accordance with certain aspects of the present disclosure.

Each of the transistors $M_1$, $M_2$, $M_3$, and $M_4$ may be controlled using four 25% duty cycle signals $P_1$, $P_2$, $P_3$, and $P_4$, as illustrated in the timing diagram 412 of FIG. 4B. In this manner, one switch 404 may be opened before or as the next switch in the control signal sequence is closed. That is, each of the transistors $M_1$, $M_2$, $M_3$, and $M_4$ may be driven such that the transistors are activated in sequence and periods during which each transistor is activated (i.e., each switch 404 is closed) do not overlap. The duty cycle of the control signals may be a function of the number N of filter branches (e.g., equal to 1/N).

Each switch 404 may connect a corresponding impedance $Z_A$, $Z_B$, $Z_C$ or $Z_D$ to the node 406 when closed. Impedances $Z_A$, $Z_B$, $Z_C$ and $Z_D$ may all have the same impedance value. One end of each impedance $Z_A$, $Z_B$, $Z_C$, or $Z_D$ may be connected with a corresponding switch 404, and the other end of each impedance may be connected with a reference potential (e.g., electrical ground, a power supply voltage, or a bias voltage) for the N-path filter 402.

In this configuration, the frequency response 410 of the N-path filter 402 may have a center frequency approximately equal to the switching frequency of the control signals $P_1$, $P_2$, $P_3$, and $P_4$ for transistors $M_1$, $M_2$, $M_3$, and $M_4$, respectively. For example, the switching frequency may be considered as the inverse of the period between rising edges of the control signal $P_1$, shown by vertical dashed lines in timing diagram 412. Moreover, the bandwidth of the frequency response 410 may be twice the bandwidth of a pole of the branch impedance ($Z_A$, $Z_B$, $Z_C$, or $Z_D$).

Figure 5:
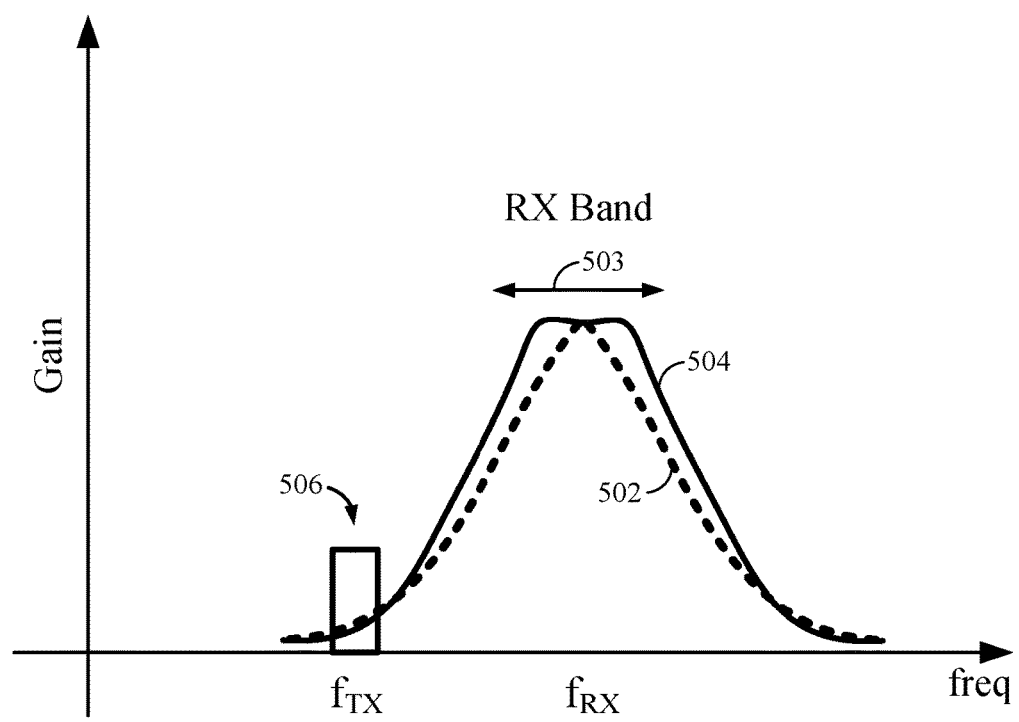
FIG. 5 illustrates an example frequency response of an N-path filter, in accordance with certain aspects of the present disclosure.

FIG. 5 illustrates example frequency responses of N-path filters. The frequency response 502 may correspond to an N-path filter configured such that each of the branch impedances (e.g., $Z_A$, $Z_B$, $Z_C$, and $Z_D$) have only one pole (e.g., implemented with a resistor-capacitor (RC) load). An N-path filter with only one pole may provide a narrow-band, high-Q bandpass filter, but when used as a filter for a wide RX band 503, may not provide sufficient out-of-band rejection. Aspects of the present disclosure provide an N-path filter having a wideband frequency response 504. For example, an N-path filter in accordance with the present disclosure may provide similar rejection at the TX leakage frequency ($f_{TX}$) 506 as a narrow-band N-path filter, but with a wide, flat passband shape.

Figure 6:
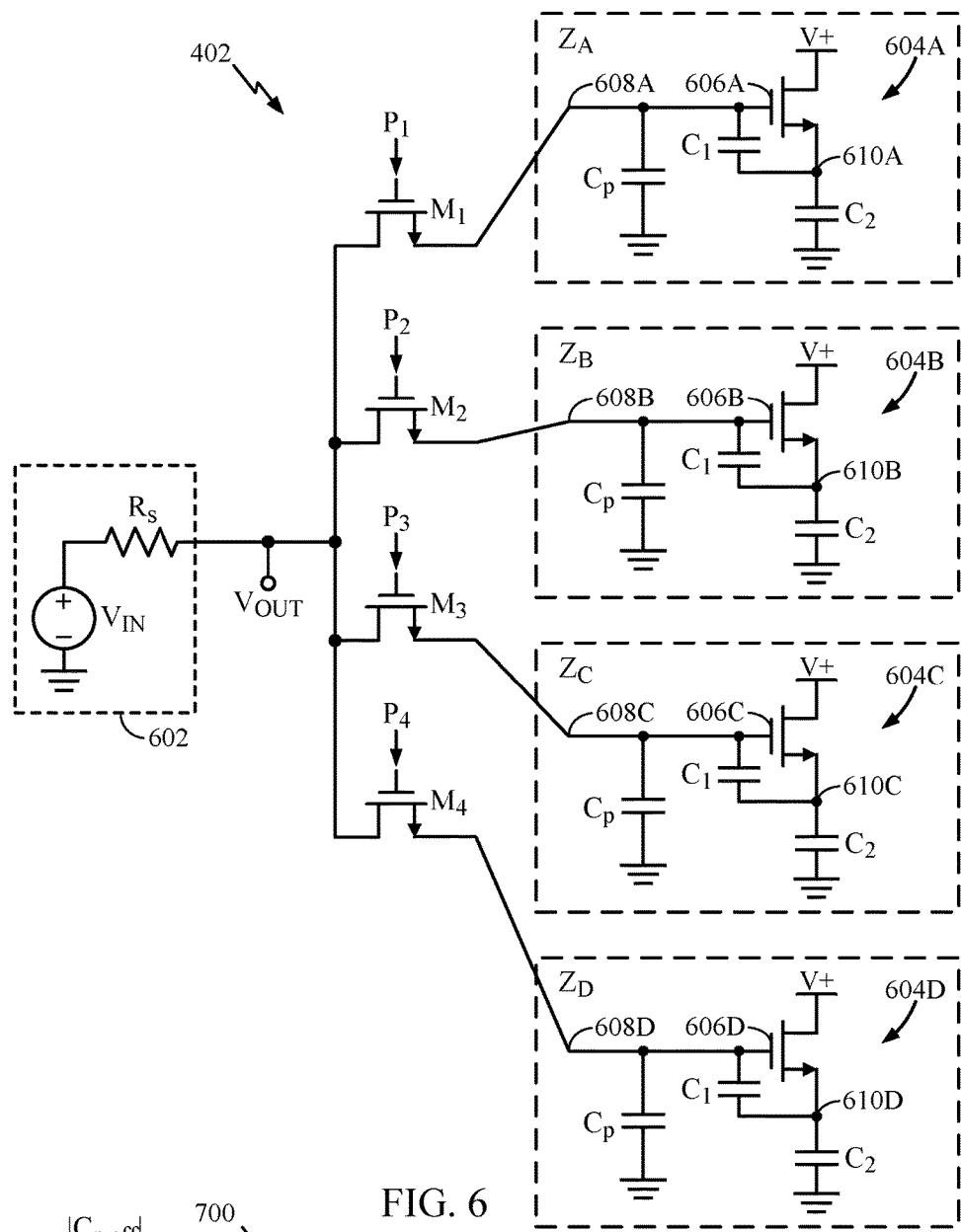
FIG. 6 illustrates an example N-path filter where each branch of the N-path filter includes a switch connected in series with an amplifier circuit, in accordance with certain aspects of the present disclosure.

FIG. 6 illustrates an N-path filter 402 where each branch of the N-path filter includes a switch connected in series with an amplifier circuit, in accordance with certain aspects of the present disclosure. The N-path filter 402 in FIG. 6 is illustrated as being connected with a Thévenin equivalent circuit 602 having an input signal (e.g., voltage source Vin) and input impedance (e.g., series resistance $R_S$), which may represent the equivalent of the signal received by the antenna 303 and amplified by the first LNA 322A. Each of the transistors $M_1$, $M_2$, $M_3$, and $M_4$ are connected via nodes 608A, 608B, 608C, and 608D (collectively "nodes 608") with capacitors $C_p$ and amplifier circuits 604A, 604B, 604C, and 604D (collectively "amplifier circuits 604"), respectively. In other words, the impedances $Z_A$, $Z_B$, $Z_C$, and $Z_D$ of the N-path filter 402 are implemented using amplifier circuits 604 connected in parallel with capacitors $C_p$.

In certain aspects, each of the amplifier circuits 604 may be a common drain amplifier circuit (also known as a source follower circuit). Each of the amplifier circuits 604 may include an NMOS transistor 606A, 606B, 606C, or 606D (collectively "transistors 606") and capacitors $C_1$ and $C_2$, as illustrated in FIG. 6. For other aspects, the transistors 606 in the amplifier circuits 604 may be implemented with PMOS transistors. However, for ease of description and understanding by the reader, the remainder of the disclosure will use NMOS transistors in the amplifier circuits 604. The drains of the transistors 606 may be connected with a power supply voltage (e.g., V+, as shown). The gates of the transistors 606 may be connected with the switches 404 (or more specifically, to the sources of transistors $M_1$, $M_2$, $M_3$, and $M_4$) via the nodes 608. The capacitors $C_1$ and $C_2$ in each branch may be connected in series via node 610A, 610B, 610C, or 610D (collectively "nodes 610"), and the nodes 610 may be connected with the sources of the transistors 606. Capacitor $C_1$ in each branch may be connected with the respective node 608 and/or to the gate of the respective transistor 606. Capacitor $C_2$ in each branch may be connected with a reference potential for the N-path filter 402 (e.g., electrical ground, as illustrated).

Figure 7:
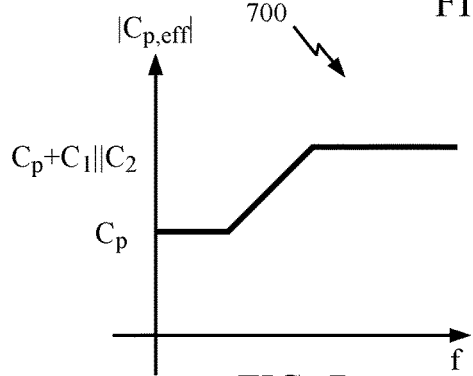
FIG. 7 is a graph illustrating example variability in capacitances of the N-path filter of FIG. 6 as a function of frequency, in accordance with certain aspects of the present disclosure.

FIG. 7 is a graph 700 illustrating an example change in the effective capacitance ($C_{p,eff}$) of impedances $Z_A$, $Z_B$, $Z_C$ and $Z_D$ in the N-path filter 402 of FIG. 6 as a function of frequency, in accordance with certain aspects of the present disclosure. The effective baseband (BB) impedance ($Z_{BB}$) of each amplifier circuit 604 and capacitor $C_p$ may be expressed as follows:

$$Z_{BB} = \frac{\left(1 + \frac{s}{\omega_Z}\right)}{C_p s \left(1 + \frac{s}{\omega_p}\right)}$$

$$\omega_Z = \frac{g_m}{(C_1 + C_2)}$$

$$\omega_p = \omega_Z \times \frac{1}{\frac{C_1 \| C_2}{C_p} + 1}$$

where $g_m$ is the transconductance of the transistor 606 in the amplifier circuit 604. As illustrated in the graph 700 of FIG. 7, the effective BB impedance may act like a dynamic capacitor having increased capacitance with increased frequency. That is, at lower BB frequencies, the effective capacitance a branch impedance (one of $Z_A$, $Z_B$, $Z_C$, or $Z_D$) may be about equal to the capacitance $C_p$, and at higher BB frequencies, the effective capacitance of this branch impedance may be about equal to $C_p + C_1 \| C_2$.

The gain of the N-path filter 402 may be calculated using the following equations:

$$\frac{V_{out,BB}}{V_{in,BB}} = \frac{1 + \frac{s}{\omega_Z}}{\frac{s^2}{\omega_p \omega_x} + \left(\frac{1}{\omega_Z} + \frac{1}{\omega_x}\right)s + 1}$$

$$\omega_x = \frac{1}{N(R_S + R_{SW})C_p}$$

where N is the number of parallel branches in the N-path filter 402, $R_{SW}$ is the switch resistance of a branch switch 404 (e.g., the on-resistance of one of transistors $M_1$, $M_2$, $M_3$, and $M_4$), and $R_S$ is the series resistance of the equivalent circuit 602 as described above.

The N-path filter 402 of FIG. 6 provides a flatter passband to reduce the in-band droop, as shown by the frequency response 504 of FIG. 5. The rejection of the N-path filter 402 may be limited by the following equation:

$$\frac{R_{SW}}{R_{SW} + R_S}$$

The addition of the amplifier circuits 604 should not degrade the linearity of the N-path filter 402 because common drain amplifier circuits typically have sufficient linearity. Moreover, the current noise from the transistors 606 of the amplifier circuits 604 should not contribute to in-band noise because the capacitors $C_1$ and $C_2$ may block the current noise. Thus, the current noise from each of the transistors 606 only circulates inside the respective transistors.

Certain aspects of the present disclosure provide for dynamic switching between including and excluding the amplifier circuits 604, effectively switching between the frequency responses 502 and 504 of the N-path filter 402. That is, the amplifier circuits 604 may be deactivated and/or disconnected in order to switch between the frequency responses 502 and 504 as desired. This may be performed, for example, by effectively removing the amplifier circuits 604 from the N-path filter 402, leaving capacitors $C_p$ connected in series with the sources of transistors $M_1$, $M_2$, $M_3$, and $M_4$. For certain aspects, a switch (not shown) between the capacitor $C_p$ and one of the amplifier circuits 604 in each branch of the N-path filter 402 may be used to effectively remove the amplifier circuits 604 from the N-path filter.

Figure 8A:
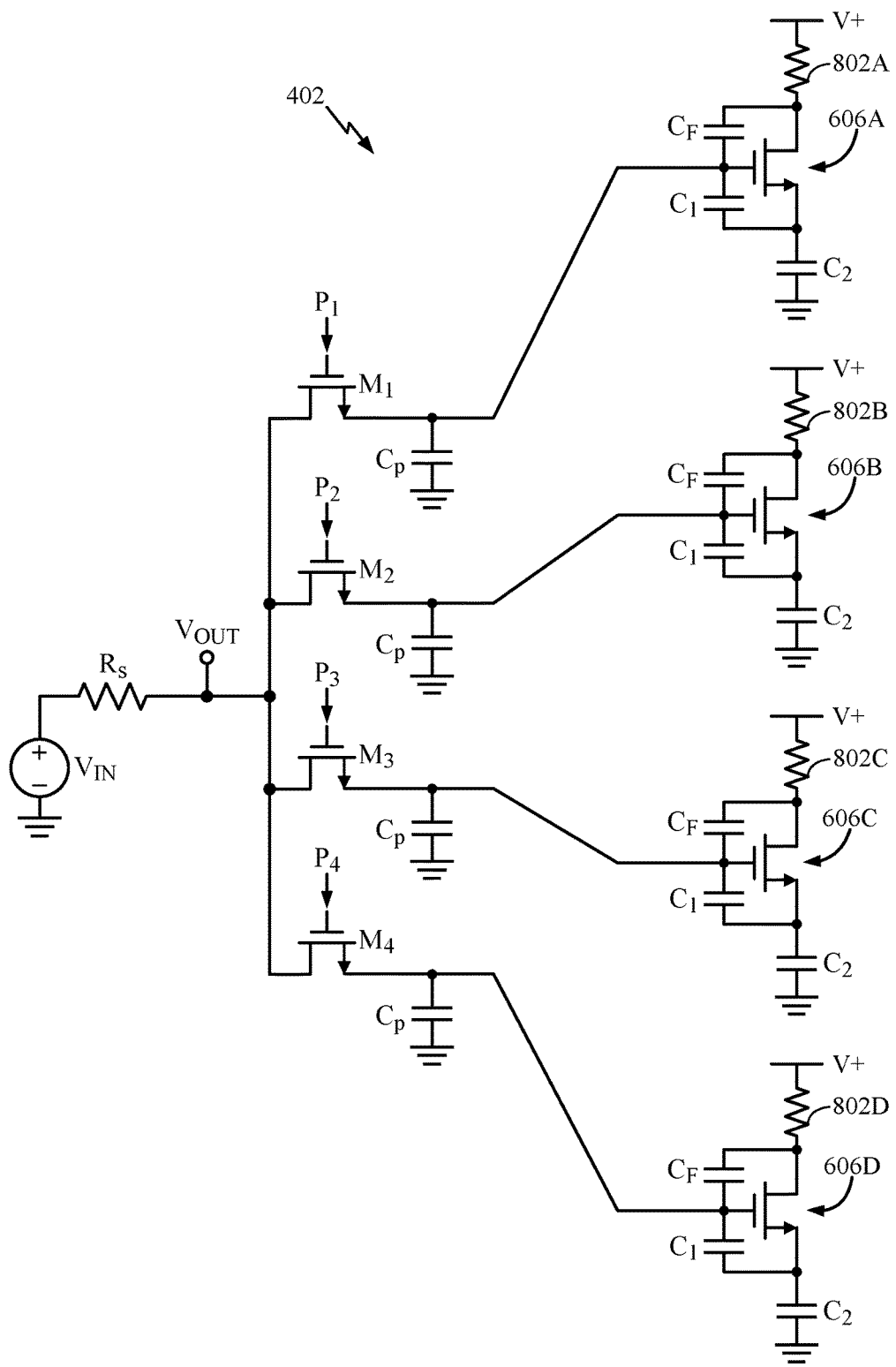
FIG. 8A illustrates the addition of feedback capacitors to the amplifier circuits in the example N-path filter of FIG. 6, in accordance with certain aspects of the present disclosure.
Figure 8B:
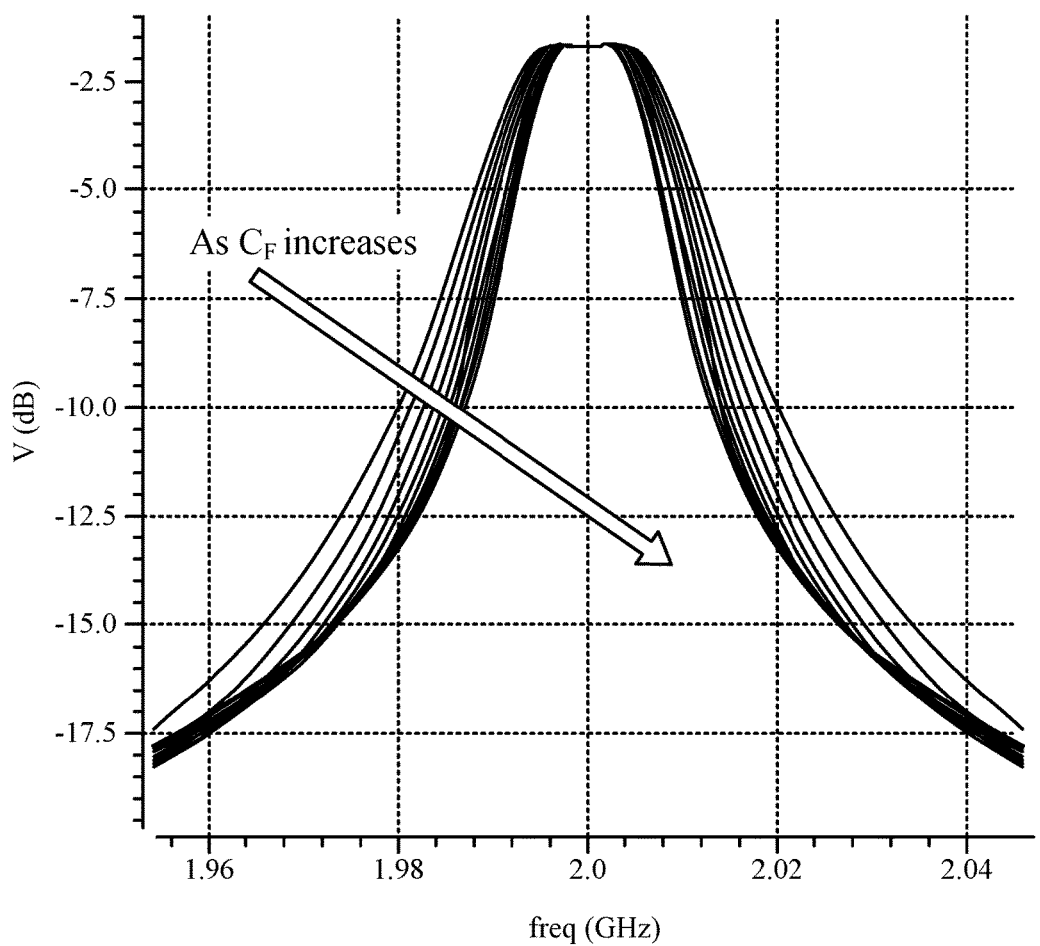
FIG. 8B is a graph of example frequency responses of the N-path filter of FIG. 8A illustrating the effect of increasing the feedback capacitance, in accordance with certain aspects of the present disclosure.

FIG. 8A illustrates the addition of feedback capacitors to the amplifier circuits 604 in the example N-path filter of FIG. 6, in accordance with certain aspects of the present disclosure. The sharpness of the frequency response 504 of the N-path filter 402 may be increased by employing capacitive feedback around the amplifier circuits 604. That is, by coupling a feedback capacitor $C_F$ between the gates and drains of the transistors 606 of the amplifier circuits 604 as shown in FIG. 8A, the sharpness of the frequency response 504 may be increased. Furthermore, using larger values of feedback capacitance $C_F$ generally increases the sharpness even further, as illustrated in FIG. 8B. In certain aspects, resistors 802A, 802B, 802C, and 802D may be connected between the voltage rail V+ and a respective one of the transistors 606 in an effort to increase the voltage swing across feedback capacitor $C_F$ and, hence, increase the effective conductance at the input of a respective amplifier circuit 604, which leads to lower bandwidth of the resultant N-path filter 402.

Figure 9:
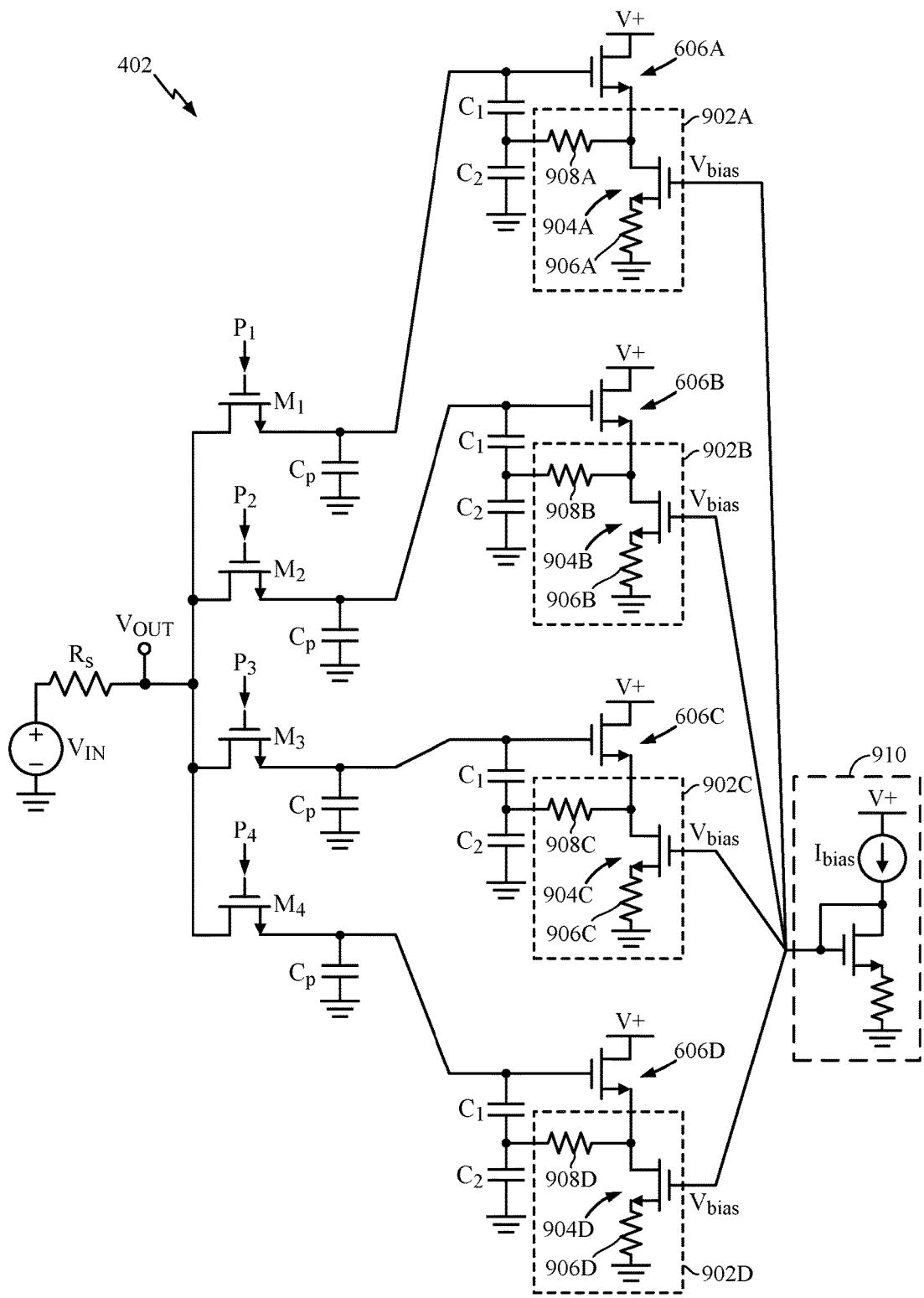
FIG. 9 illustrates the addition of degeneration circuits to the amplifier circuits in the example N-path filter of FIG. 6, in accordance with certain aspects of the present disclosure.

FIG. 9 illustrates an example N-path filter 402 in which a degeneration circuit is added to the amplifier circuit 604 of FIG. 6 in each branch, in accordance with certain aspects of the present disclosure. A degeneration circuit may be used to increase the stability of each of the amplifier circuits 604, albeit at a cost of reduced gain. For example, the degeneration circuits 902A, 902B, 902C, and 902D (collectively "degeneration circuits 902") may be connected with respective sources of the transistors 606 in each branch. Each of the degeneration circuits 902 may include a respective transistor 904A, 904B, 904C, or 904D (collectively "transistors 904") and a respective resistor 906A, 906B, 906C, or 906D (collectively "resistors 906") connected with a source of a respective one of the transistors 904. The resistors 906 may also be connected with the reference potential for the N-path filter 402. In certain aspects, resistors 908A, 908B, 908C, and 908D are connected between the sources of the respective transistors 606 (and/or the drains of the respective transistors 904) and the respective nodes 610 between capacitors $C_1$ and $C_2$. The gates of the transistors 904 may be biased by a signal $V_{bias}$ generated by a biasing circuit 910 that, together with the respective transistors 904 and resistors 906, may act as a current mirror with current source $I_{bias}$. In certain aspects, each of the transistors 904 may be biased such that about 0.5 mA of current flows across each of the resistors 906.

Figure 10A:
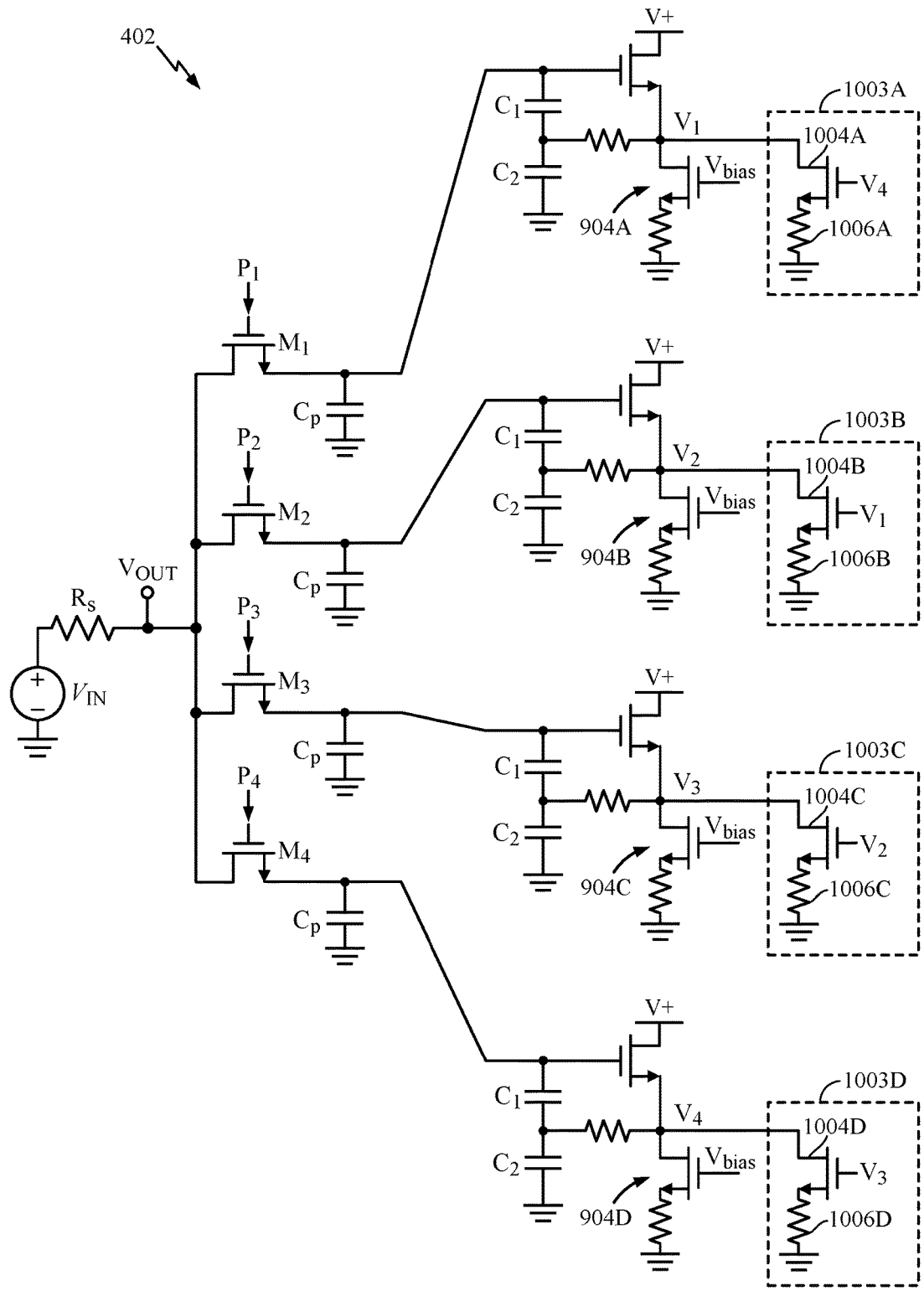
FIG. 10A illustrates the addition of degeneration circuits and poly-phase feedback circuits to the amplifier circuits in the example N-path filter of FIG. 6, in accordance with certain aspects of the present disclosure.
Figure 10B:
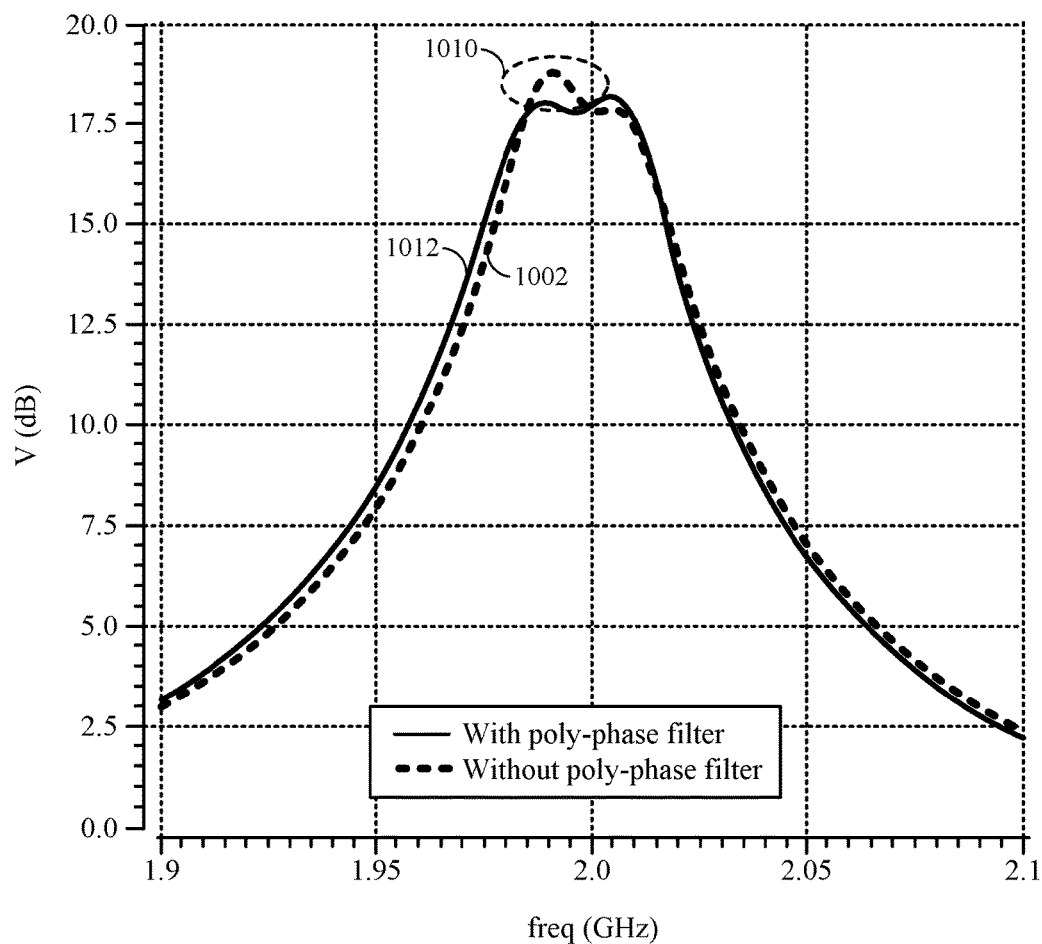
FIG. 10B is a graph of example frequency responses of the N-path filter of FIG. 10A, both with and without the poly-phase feedback circuits activated, in accordance with certain aspects of the present disclosure.

Parasitic capacitance at an RF node (e.g., node 406 of FIG. 4) may act as a complex load to the N-path filter 402. This may lead to large in-band peaking 1010 as illustrated by frequency response 1002 of FIG. 10B. To resolve the in-band peaking 1010, poly-phase feedback circuits 1003A, 1003B, 1003C, and 1003D (collectively "poly-phase feedback circuits 1003") may be added to the respective amplifier circuits 604 of FIG. 9 as illustrated in FIG. 10A. The addition of the poly-phase feedback circuits 1003 leads to an N-phase filter with frequency response 1012 of FIG. 10B, which has a flatter response without the large in-band peaking 1010.

For certain aspects, the poly-phase feedback circuits 1003A, 1003B, 1003C, and 1003D include transistors 1004A, 1004B, 1004C, and 1004D (collectively "transistors 1004"), respectively, which may be connected with the drain of transistors 904 (and/or to the sources of transistors 606). The transistors 1004 may be connected via respective resistors 1006A, 1006B, 1006C, and 1006D with a reference potential (e.g., the reference potential of the N-path filter 402). The gate of the respective transistors 1004 in each branch may be driven by a signal at the source of a transistor 606 in a different branch of the N-path filter 402. For example, as illustrated in FIG. 10A, the gate of transistor 1004A may be driven by voltage signal $V_4$ at the source of transistor 606D, the gate of transistor 1004B may be driven by voltage signal $V_1$ at the source of transistor 606A, and so on.

Figure 11:
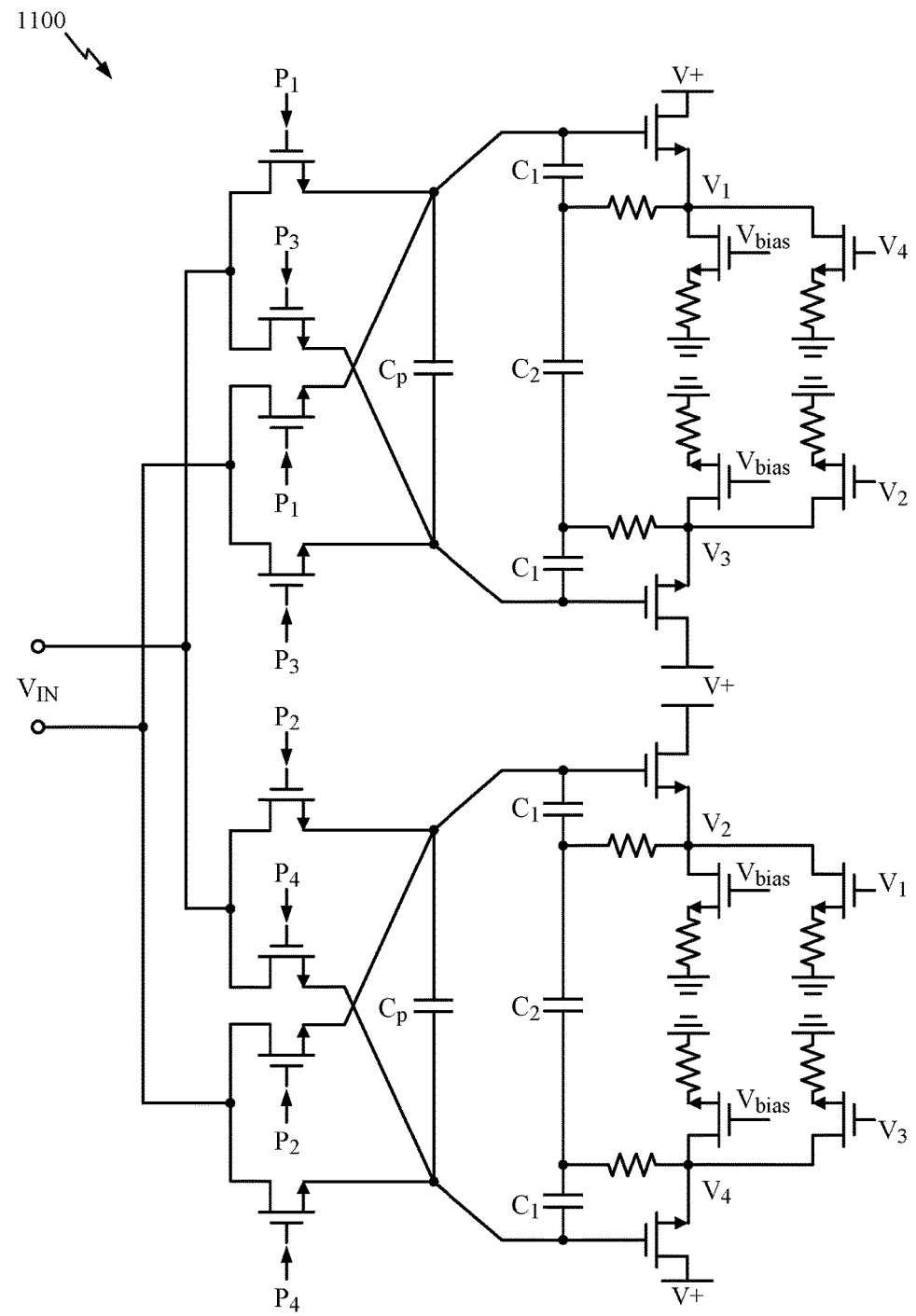
FIG. 11 illustrates an example differential N-path filter with degeneration circuits and poly-phase feedback circuits, in accordance with certain aspects of the present disclosure.

FIG. 11 illustrates an example differential N-path filter 1100, in accordance with certain aspects of the present disclosure. As illustrated, the differential N-path filter 1100 includes degeneration circuits 902 and poly-phase feedback circuits 1003, as described above. Using a differential N-path filter 1100 in accordance with FIG. 11 may decrease phase noise and reduce the area consumed by the N-path filter. For example, instead of having four capacitors $C_p$ and four capacitors $C_2$ as in the N-path filter 402 of FIG. 10A, only two capacitors $C_p$ and two capacitors $C_2$ may be used in the differential N-path filter 1100. Moreover, the capacitance of capacitors $C_p$ and $C_2$ in the differential N-path filter 1100 of FIG. 11 may be half of their respective capacitances in the N-path filter 402 of FIG. 10A, having a single-ended configuration.

Figure 12:
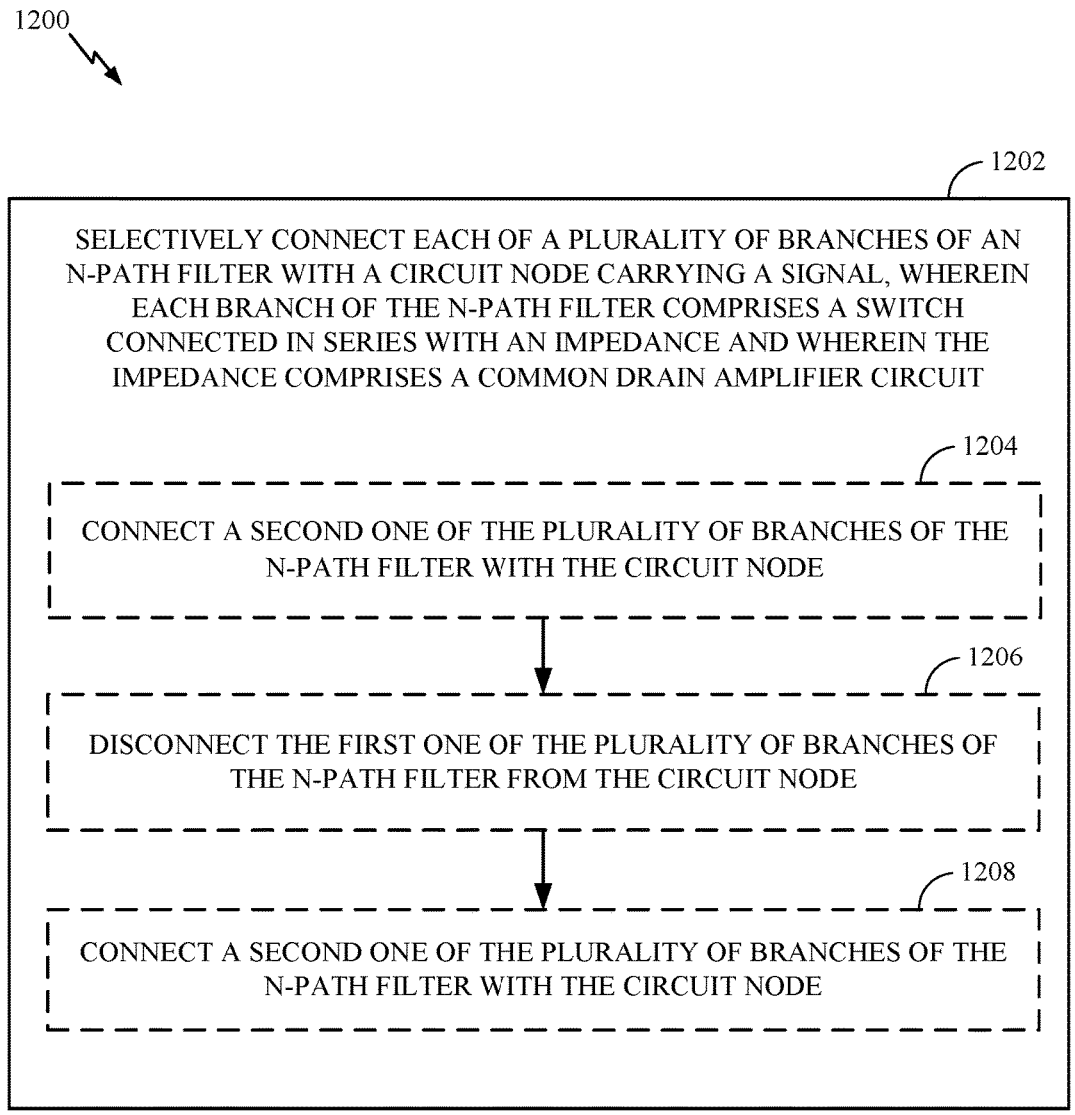
FIG. 12 is a flow diagram of example operations for filtering a signal, in accordance with certain aspects of the present disclosure.

FIG. 12 is a flow diagram of example operations 1200 for filtering a signal, in accordance with certain aspects of the present disclosure. The operations 1200 may be performed by an N-path filter, such as those described herein. The signal may be, for example, the output of an amplifier, such as the first LNA 322A.

The operations 1200 may begin, at block 1202, by selectively connecting each of a plurality of branches of an N-path filter (e.g., N-path filter 402) with a circuit node (e.g., node 406) carrying the signal. Each branch of the N-path filter includes a switch (e.g., switch 404) connected in series with an impedance (e.g., one of the impedances $Z_A$, $Z_B$, $Z_C$ and $Z_D$). The impedance includes a common drain amplifier circuit (e.g., one of the amplifier circuits 604). For certain aspects, the impedance in each branch of the N-path filter further includes a capacitor (e.g., capacitor $C_p$) connected in parallel with the common drain amplifier circuit.

According to certain aspects, selectively connecting at block 1202 may involve connecting one of the plurality of branches of the N-path filter according to a control signal (e.g., one of signals $P_1$, $P_2$, $P_3$, and $P_4$). In this case, a switching frequency of the control signal may establish a center frequency of a frequency response (e.g., frequency response 504) of the N-path filter.

According to certain aspects, selectively connecting at block 1202 entails connecting a first one of the plurality of branches of the N-path filter with the circuit node at block 1204; disconnecting the first one of the plurality of branches of the N-path filter from the circuit node at block 1206; and after the disconnecting at block 1206, connecting a second one of the plurality of branches of the N-path filter with the circuit node at block 1208. For certain aspects, a period between connecting and disconnecting the first one of the plurality of branches at blocks 1204 and 1206 (e.g., the pulse width of a control signal $P_1$, $P_2$, $P_3$, or $P_4$) is determined based on an inverse of a center frequency of the N-path filter divided by a number of the plurality of branches.

According to certain aspects, the signal is an output of an amplifier (e.g., the first LNA 322A) in a receive path (e.g., RX path 304) of a transceiver (e.g., transceiver front end 300). In this case, selectively connecting each of the plurality of branches of the N-path filter at block 1202 suppresses leakage from a transmit path (e.g., TX path 302) of the transceiver.

According to certain aspects, the common drain amplifier circuit includes a first transistor (e.g., transistor 606). A gate of the first transistor may be coupled to a node (e.g., one of the nodes 608) between the switch and the impedance. For certain aspects, the common drain amplifier circuit further includes a first capacitor (e.g., capacitor $C_1$) and a second capacitor (e.g., capacitor $C_2$). In this case, the first capacitor may be coupled to the gate of the first transistor and connected in series with the second capacitor, and the second capacitor may be coupled to a reference potential (e.g., electrical ground, a power supply voltage, or a bias voltage) for the N-path filter. A node (e.g., one of the nodes 610) between the first capacitor and the second capacitor may be coupled to a source of the first transistor. For certain aspects, the common drain amplifier circuit further includes a resistor (e.g., one of the resistors 908) coupled between the source of the first transistor and the node between the first capacitor and the second capacitor. For certain aspects, the common drain amplifier circuit further includes a degeneration circuit (e.g., one of the degeneration circuits 902) coupled between the source of the first transistor and the reference potential for the N-path filter. In this case, the degeneration circuit may include a second transistor (e.g., one of the transistors 904) and a resistor (e.g., one of the resistors 906); a drain of the second transistor may be coupled to the source of the first transistor; a source of the second transistor may be coupled to the resistor; a gate of the second transistor may be coupled to a biasing circuit (e.g., biasing circuit 910); and/or the resistor may be coupled to the reference potential for the N-path filter. For certain aspects, the common drain amplifier circuit further includes a poly-phase feedback circuit (e.g., one of poly-phase feedback circuits 1003) connected in parallel with the degeneration circuit. In this case, the poly-phase feedback circuit in each branch of the N-path filter may be controlled by a voltage at the source of the first transistor in a different branch of the N-path filter. The poly-phase feedback circuit may include a second transistor (e.g., one of the transistors 1004) and a resistor (e.g., one of the resistors 1006); a drain of the second transistor may be coupled to the source of the first transistor; a source of the second transistor may be coupled to the resistor; a gate of the second transistor may be coupled to the source of the first transistor in a different branch of the N-path filter; and the resistor may be coupled to the reference potential for the N-path filter.

According to certain aspects, the N-path filter is implemented differentially (e.g., as illustrated in FIG. 11).

According to certain aspects, each branch of the N-path filter comprises only one active device (e.g., transistor 606).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2 or the RX data processor 242, the TX data processor 210, and/or the controller 230 of the access point 110 shown in FIG. 2.

Furthermore, means for carrying a signal may comprise a wire, trace, a circuit node (e.g., node 406 as illustrated in FIG. 4A), an optical fiber, or any other suitable electrical or optical conductor, which may be reflected in a schematic circuit diagram. Means for selectively connecting may comprise a switching arrangement (e.g., switches 404 depicted in FIG. 4A). Means for connecting and/or means for disconnecting may comprise a switch (e.g., switches 404 as illustrated in FIG. 4A), which may be implemented with transistors, for example. Means for amplifying may comprise an amplifier or amplifying circuit (e.g., common drain amplifier circuits 604 as portrayed in FIG. 6). Means for impeding (a signal) may comprise an electrical component with positive or negative impedance, such as an inductor or a capacitor (e.g., capacitor $C_p$ as illustrated in FIG. 6).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An N-path filter comprising:
a plurality of branches selectively connected with a common node, each branch of the N-path filter comprising a switch connected in series with an impedance comprising a common drain amplifier circuit, wherein:
the common drain amplifier circuit comprises a first transistor, a first capacitor, and a second capacitor;
a gate of the first transistor is coupled to a node between the switch and the impedance;
the first capacitor is coupled to the gate of the first transistor and connected in series with the second capacitor; and
the second capacitor is coupled to a reference potential for the N-path filter.

2. The N-path filter of claim 1, wherein the impedance in each branch of the N-path filter further comprises a capacitor connected in parallel with the common drain amplifier circuit.

3. The N-path filter of claim 1, wherein a node between the first capacitor and the second capacitor is coupled to a source of the first transistor.

4. The N-path filter of claim 3, wherein the common drain amplifier circuit further comprises a resistor coupled between the source of the first transistor and the node between the first capacitor and the second capacitor.

5. The N-path filter of claim 3, wherein the common drain amplifier circuit further comprises a degeneration circuit coupled between the source of the first transistor and the reference potential for the N-path filter.

6. The N-path filter of claim 5, wherein:
the degeneration circuit comprises a second transistor and a resistor;
a drain of the second transistor is coupled to the source of the first transistor;
a source of the second transistor is coupled to the resistor;
a gate of the second transistor is coupled to a biasing circuit; and
the resistor is coupled to the reference potential for the N-path filter.

7. The N-path filter of claim 5, wherein the common drain amplifier circuit further comprises a poly-phase feedback circuit connected in parallel with the degeneration circuit and wherein the poly-phase feedback circuit in each branch of the N-path filter is controlled by a voltage at the source of the first transistor in a different branch of the N-path filter.

8. The N-path filter of claim 7, wherein:
the poly-phase feedback circuit comprises a second transistor and a resistor;
a drain of the second transistor is coupled to the source of the first transistor;
a source of the second transistor is coupled to the resistor;
a gate of the second transistor is coupled to the source of the first transistor in a different branch of the N-path filter; and
the resistor is coupled to the reference potential for the N-path filter.

9. The N-path filter of claim 1, wherein the N-path filter is implemented differentially.

10. The N-path filter of claim 1, wherein each branch of the N-path filter comprises only one active device.

11. The N-path filter of claim 1, wherein the N-path filter is configured to filter an output of an amplifier in a receive path of a transceiver and wherein the N-path filter is configured to suppress leakage from a transmit path of the transceiver.

12. A method for filtering a signal, comprising selectively connecting each of a plurality of branches of an N-path filter with a circuit node carrying the signal, each branch of the N-path filter comprising a switch connected in series with an impedance comprising a common drain amplifier circuit, wherein:
the common drain amplifier circuit comprises a first transistor, a first capacitor, and a second capacitor;
a gate of the first transistor is coupled to a node between the switch and the impedance;
the first capacitor is coupled to the gate of the first transistor and connected in series with the second capacitor; and
the second capacitor is coupled to a reference potential for the N-path filter.

13. The method of claim 12, wherein the impedance in each branch of the N-path filter further comprises a capacitor connected in parallel with the common drain amplifier circuit.

14. The method of claim 12, wherein the selectively connecting comprises connecting one of the plurality of branches of the N-path filter according to a control signal and wherein a switching frequency of the control signal establishes a center frequency of a frequency response of the N-path filter.

15. The method of claim 12, wherein the selectively connecting comprises:
connecting a first one of the plurality of branches of the N-path filter with the circuit node;
disconnecting the first one of the plurality of branches of the N-path filter from the circuit node; and
after the disconnecting, connecting a second one of the plurality of branches of the N-path filter with the circuit node.

16. The method of claim 15, wherein a period between connecting and disconnecting the first one of the plurality of branches is determined based on an inverse of a center frequency of the N-path filter divided by a number of the plurality of branches.

17. The method of claim 12, wherein the signal comprises an output of an amplifier in a receive path of a transceiver and wherein selectively connecting each of the plurality of branches of the N-path filter suppresses leakage from a transmit path of the transceiver.

18. The method of claim 12, wherein:
a node between the first capacitor and the second capacitor is coupled to a source of the first transistor; and
the common drain amplifier circuit further comprises a resistor coupled between the source of the first transistor and the node between the first capacitor and the second capacitor.

19. An apparatus for filtering a signal, comprising:
means for carrying the signal; and
means for selectively connecting each of a plurality of branches of the apparatus with the means for carrying the signal, each branch of the apparatus comprising means for amplifying, wherein:
    the means for amplifying comprises a first transistor, a first capacitor, and a second capacitor;
    a gate of the first transistor is coupled to a node between the means for selectively connecting and the branch;
    the first capacitor is coupled to the gate of the first transistor and connected in series with the second capacitor; and
    the second capacitor is coupled to a reference potential for the apparatus.

20. The apparatus of claim 19, wherein:
the means for selectively connecting comprises means for connecting one of the plurality of branches of the apparatus according to a control signal; and
a switching frequency of the control signal establishes a center frequency of a frequency response of the apparatus.

21. The apparatus of claim 19, wherein the means for selectively connecting comprises:
    means for connecting a first one of the plurality of branches of the apparatus with the means for carrying the signal;
    means for disconnecting the first one of the plurality of branches of the apparatus from the means for carrying the signal; and
    means for connecting a second one of the plurality of branches of the apparatus with the means for carrying the signal after the disconnecting.

* * * * *